United States Patent
Hagihara

(10) Patent No.: US 10,837,768 B2
(45) Date of Patent: Nov. 17, 2020

(54) SHAPE MEASUREMENT METHOD AND SHAPE MEASUREMENT APPARATUS

(71) Applicant: Toshiba Memory Corporation, Tokyo (JP)

(72) Inventor: Kazuki Hagihara, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/291,629

(22) Filed: Mar. 4, 2019

(65) Prior Publication Data

US 2020/0088516 A1 Mar. 19, 2020

(30) Foreign Application Priority Data

Sep. 13, 2018 (JP) ................. 2018-171860

(51) Int. Cl.
*G01B 15/04* (2006.01)
*G01B 11/00* (2006.01)
*G01B 11/24* (2006.01)

(52) U.S. Cl.
CPC ................... *G01B 15/04* (2013.01)

(58) Field of Classification Search
CPC .... G01B 11/02; G01B 2210/56; G01B 11/00; G01B 11/24; G01B 11/26; G01B 11/028; G01B 15/04
See application file for complete search history.

(56) References Cited

U.S. PATENT DOCUMENTS

| 8,243,880 B2 | 8/2012 | Ishibashi |
| 9,863,764 B2 | 1/2018 | Yamanaka |
| 2006/0186362 A1* | 8/2006 | Bills .................. G01N 21/21 250/559.46 |
| 2015/0012239 A1 | 1/2015 | Ishibashi |
| 2016/0223476 A1* | 8/2016 | Quintanilha ........ G03F 7/70591 |

FOREIGN PATENT DOCUMENTS

JP 2015011024 A 1/2015

* cited by examiner

Primary Examiner — David P Porta
Assistant Examiner — Fani Boosalis
(74) Attorney, Agent, or Firm — Kim & Stewart LLP

(57) ABSTRACT

According to one embodiment, a substrate measurement method comprises irradiating a substrate with an electromagnetic wave, such as an X-ray, at a plurality of incident azimuth angles with respect to an orientation of a repetitive array on the substrate. The irradiating conditions are varied in different incident azimuth angle ranges. The repetitive array comprises a pattern feature, such as a hole or a pillar, for example. The scattering intensity of the electromagnetic waves scattered from the substrate is measured at each of the different incident azimuth angles. Shape information for the pattern feature in the is calculated based on the measured scattering intensity of the electromagnetic waves at the plurality of incident azimuth angles.

18 Claims, 7 Drawing Sheets

FIG. 3A
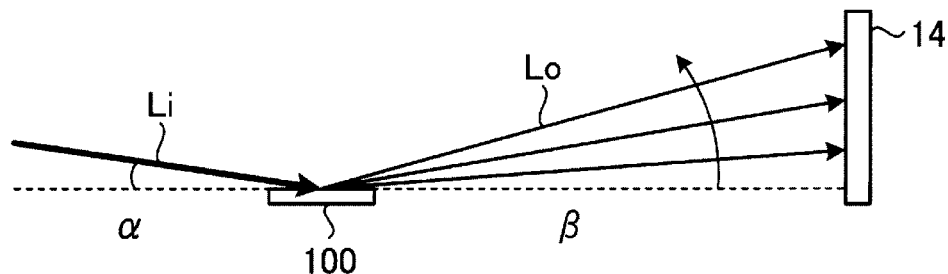
FIG. 3B
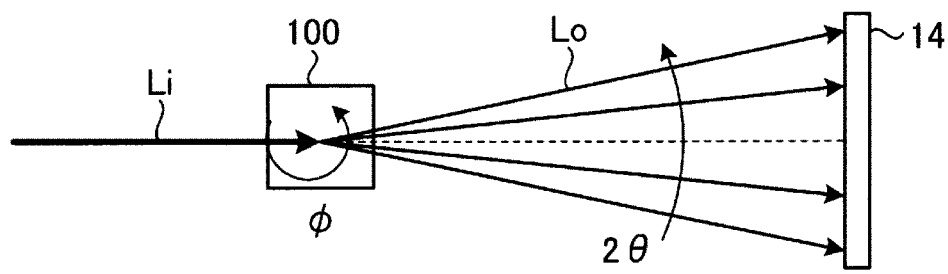
FIG. 4
| RANGE | R1 | R2 | R3 |
|---|---|---|---|
| INCIDENT AZIMUTH ANGLE $\phi$ (°) | −5〜5 | 5〜85 | 85〜95 |
| OBLIQUE INCIDENT ANGLE $\alpha$ (°) | 0.24 | 0.24 | 0.25 |
| ROTATION SPEED (s/10°) | 1000 | 300 | 1500 |
| SLIT WIDTH (mm) | 0.09 | 0.15 | 0.15 |

SHAPE MEASUREMENT METHOD AND SHAPE MEASUREMENT APPARATUS

CROSS-REFERENCE TO RELATED APPLICATION

This application is based upon and claims the benefit of priority from. Japanese Patent Application No. 2018-171860, filed Sep. 13, 2018, the entire contents of which are incorporated herein by reference.

FIELD

Embodiments described herein relate generally to a shape measurement method and a shape measurement apparatus.

BACKGROUND

A grazing incidence small angle X-ray scattering method (hereinafter referred to as GISAXS) has been proposed as a technique for measuring characteristics of a minute hole pattern formed of holes periodically arranged in two dimensions in a semiconductor manufacturing process.

In GISAXS, when measuring a three-dimensional shape of the minute pattern, an incident azimuth angle is changed at a constant speed and a measurement is repeatedly performed at every incident azimuth angle under otherwise the same conditions. However, with this method, cross-sectional shape measurement accuracy varies depending on the orientation of the minute pattern.

DESCRIPTION OF THE DRAWINGS

FIGS. 3A and 3B depict aspects of a scattered X-ray detection by a two-dimensional detector in a shape measurement apparatus.

FIG. 4 depicts a table of measurement conditions according to an embodiment.

DETAILED DESCRIPTION

Example embodiments provide a shape measurement method and a shape measurement apparatus by which a shape of a periodically arranged minute pattern can be measured with higher accuracy than existing art regardless of orientation of the minute pattern.

In general, according to one embodiment, a substrate measurement method comprises irradiating the substrate with an electromagnetic wave at a plurality of incident azimuth angles with respect to an orientation of a repetitive array on the substrate. The irradiating conditions are varied for different incident azimuth angle ranges. The repetitive array comprises a pattern feature, such as a hole or a pillar. The scattering intensity of the electromagnetic waves scattered from the substrate is measured at each different incident azimuth angles. Shape information for the pattern feature is calculated based on the scattering intensity of the electromagnetic waves at the plurality of incident azimuth angles.

Hereinafter, a shape measurement method and a shape measurement apparatus according to an example embodiment will be described in detail with reference to the accompanying drawings. It should be noted that the present disclosure is not limited by the example embodiment.

Figure 1:
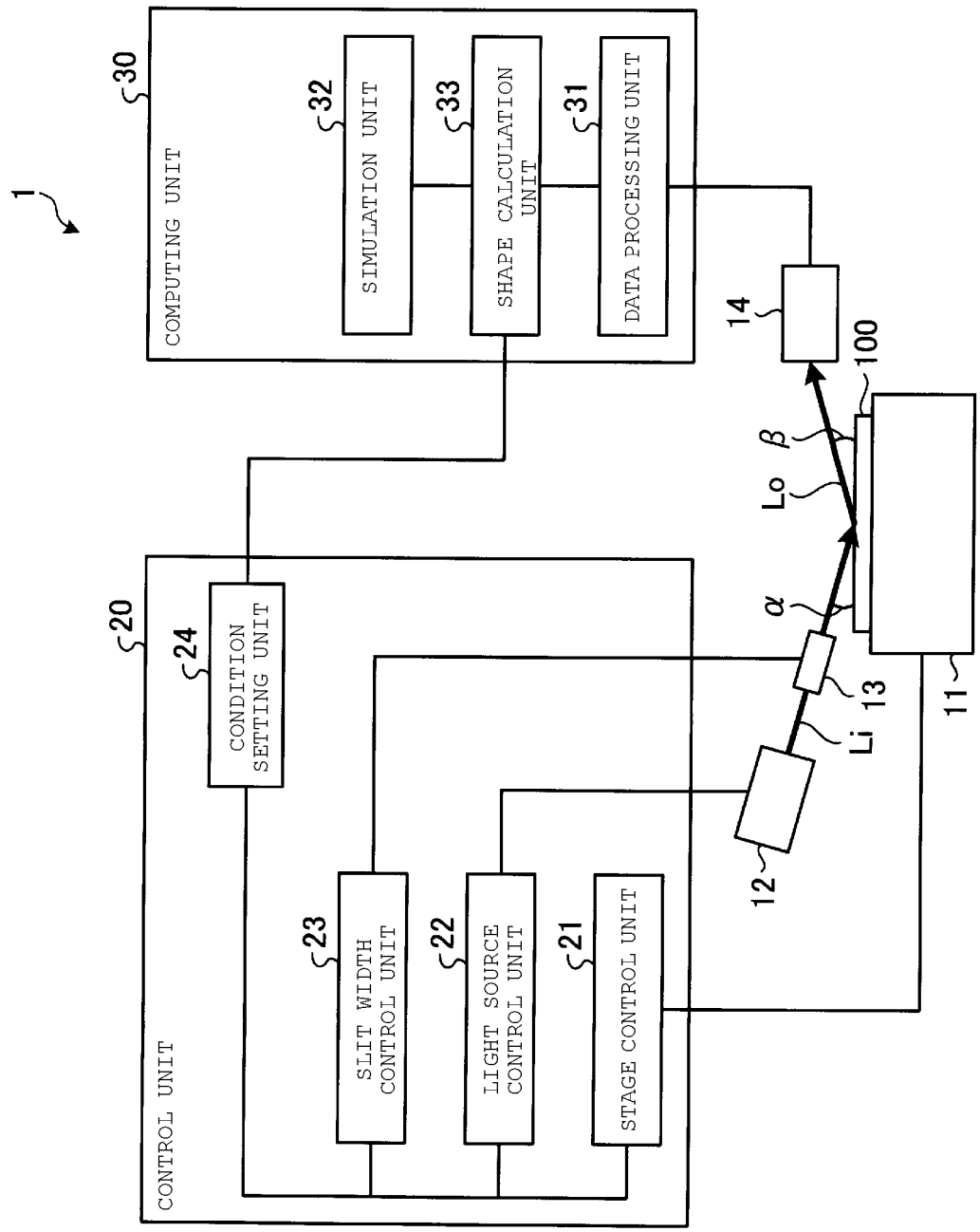
FIG. 1 is a block diagram of a shape measurement apparatus according to an embodiment.

FIG. 1 is a block diagram schematically showing an example of a configuration of a shape measurement apparatus according to an embodiment. Here, the shape measurement apparatus 1 is a GISAXS apparatus.

The shape measurement apparatus 1 includes a stage 11, an X-ray tube 12, a divergence slit 13, a two-dimensional detector 14, a control unit 20, and a computing unit 30.

On the stage 11 is placed a substrate 100 to be measured. The stage 11 is configured to be movable in a direction parallel to a substrate placement surface by a driving mechanism and configured to be rotatable on a surface parallel to the substrate placement surface. In the substrate 100, a structured portion, also referred to as a pattern element, of a specific shape is periodically arranged in two planar dimensions. The structured portion is the unit structure of a periodic structure formed on the substrate 100. Holes, such as memory holes, or pillars are examples of the structured portions. A periodic pattern of holes may be referred to as a hole pattern. A periodic pattern of pillars may be referred to as a pillar pattern.

Figure 2:
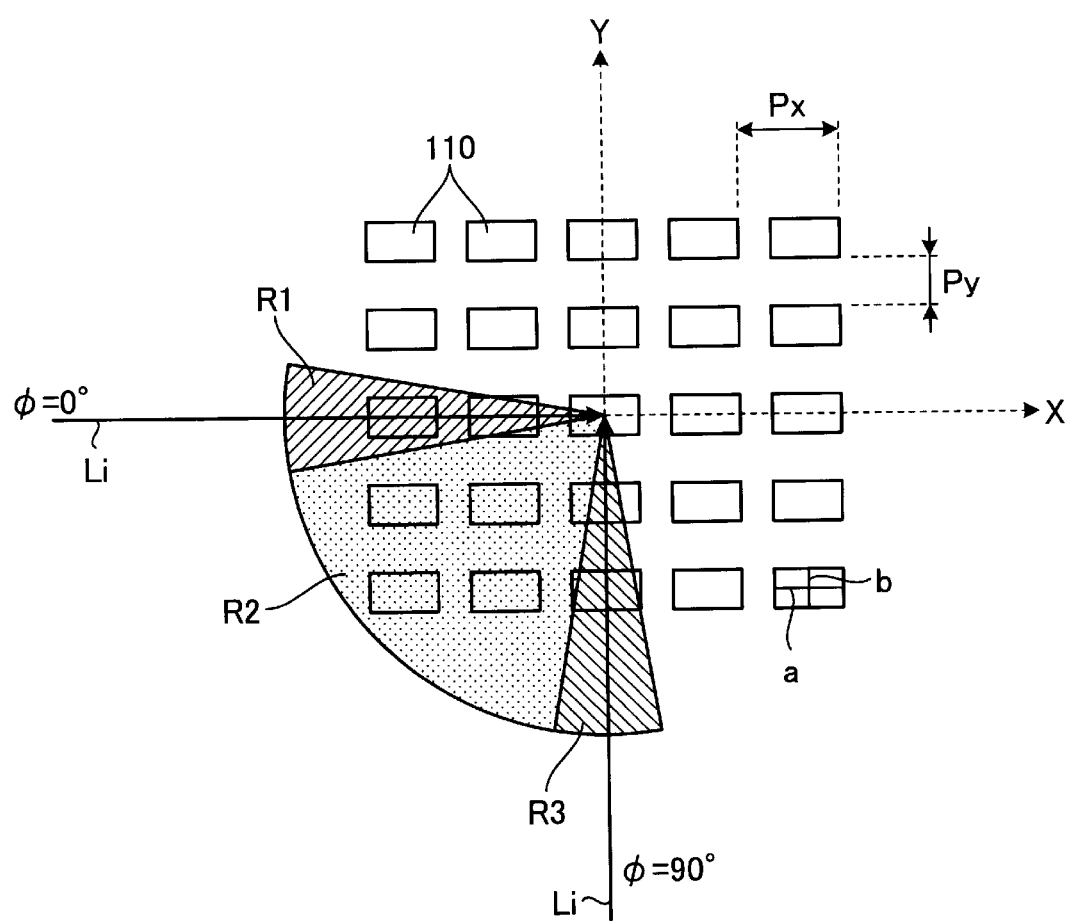
FIG. 2 is a top view of a measurement target.

FIG. 2 is a top view showing an example of a measurement target. FIG. 2 shows a case where the structured portion is a memory hole 110. Here, the memory hole 110 has a rectangular shape including a long side and a short side. However, a rectangular shape is only one example, and other shapes such as an elliptical shape or the like may be used. The direction paralleling the long side of the memory hole 110 is defined as an X axis, and the direction paralleling the short side is defined as a Y axis. Here, the X axis and the Y axis are orthogonal to each other. The memory holes 110 are periodically arranged at a pitch length Px in the X direction and are periodically arranged at a pitch length Py in the Y direction. In this example, Px>Py. The substrate 100 thus has a periodic structure thereon in which the memory holes 110 are periodically arranged in two planar dimensions.

The X-ray tube 12 comprises a light source for generating X-rays of a predetermined wavelength and a concave mirror. The light source is not particularly limited as long as it generates X-rays, for example, copper Kα-rays. The X-ray tube 12 receives a control signal from a light source control unit 22, and generates X-rays Li having a wavelength of, for example, 1 nm or less. An optical path of the incident X-ray Li is adjusted by the concave mirror in the X-ray tube 12, and the periodic structure in the substrate 100 is irradiated with the incident X-rays Li at a desired oblique incidence angle α to the substrate 100.

The divergence slit 13 is a slit for adjusting the width of the incident X-ray Li with which the substrate 100 is irradiated. When it is desired to increase the intensity of the incident X-ray Li, the width of the divergence slit 13 can be widened.

The two-dimensional detector 14 is disposed at a position sufficiently distant from the periodic structure disposed on the substrate 100 and detects X-rays Lo, which have been scattered and diffracted by the periodic structure, with light receiving elements. The two-dimensional detector 14 measures intensity the scattered X-rays Li which reach the light receiving elements. The two-dimensional detector 14 has a light receiving unit in which the light receiving elements are arranged in two dimensions. Each light receiving element measures intensity of the incident scattered X-rays Lo and creates a two-dimensional image corresponding to the intensity of incident X-rays Lo received across the entire light receiving unit (hereinafter referred to as X-ray scattering intensity), by associating the measured intensity with the position of each light receiving element in the light receiving unit. The two-dimensional detector 14 outputs the two-dimensional image corresponding to the X-ray scattering intensity to the data processing unit 31.

FIGS. 3A and 3B are diagrams depicting scattered X-ray detection by the two-dimensional detector. FIG. 3A shows a side view and FIG. 3B shows a top view. As shown in FIG. 3A, the incident X-ray Li is incident on the substrate 100 at an oblique incidence angle α, and is scattered at various output angles β within a surface including the optical paths of the incident X-rays Li. At each position of the two-dimensional detector 14, the intensity of the scattered X-rays Lo scattered at the various output angles β is detected. It is noted that the oblique incidence angle α is an angle fairly close to zero (horizontal), and is usually set to an angle of around 0.2°.

As shown in FIG. 3B, the incident X-rays Li are incident on the substrate 100 at an incident azimuth angle φ and are diffracted at various diffraction angles 2θ. At each position of the two-dimensional detector 14, the intensity of the scattered X-rays Lo scattered at the various diffraction angles 2θ is detected. Here, as shown in FIG. 2, an angle formed by a reference direction in the memory holes 110 constituting the periodic structure and an incident direction of the incident X-ray Li is referred to as an incident azimuth angle φ. For example, in FIG. 2, a direction of the long side of the memory hole 110, that is, the X direction is set as a reference direction. When the long side (X direction) of the memory hole 110 and the incident direction of the incident X-ray Li are parallel to each other, the incident azimuth angle φ is 0°, and when the long side (X direction) of the memory hole 110 and the incident direction of the incident X-ray Li are perpendicular, the incident azimuth angle φ is 90°. In the drawing, the positions of the incident X-rays Li are varied, but the incident azimuth angle φ may also be changed by rotating the stage 11.

The control unit 20 has a stage control unit 21, a light source control unit 22, a slit width control unit 23, and a condition setting unit 24. By moving the stage 11, the stage control unit 21 controls the position at which the X-ray Li is incident on the substrate 100 (by translational motion of the substrate 100) and the incident azimuth angle φ (by rotational motion of the substrate 100).

The light source control unit 22 controls the angle (oblique incidence angle) of the X-ray Li to the substrate 100 and the output of the X-ray Li from the X-ray tube 12.

The slit width control unit 23 controls the width of the divergence slit 13 for determining an irradiation area (beam size) for the incident X-ray Li.

When measuring the substrate 100, the condition setting unit 24 sets measurement conditions in the stage control unit 21, namely the light source control unit 22, the slit width control unit 23, and a shape calculation unit 33. In the present embodiment, shape measurement is performed by varying the oblique incidence angle α, the slit width, and the rotation speed of the stage 11 in accordance with the incident azimuth angle φ, rather than by attempting shape measuring with the oblique incidence angle α, the slit width and the rotation speed of the stage 11 kept constant.

For example, with respect to measuring characteristic of memory holes, when it is known by experiment that the preferred conditions for acquiring surface shape information in the short side direction with high accuracy differ from the preferred conditions for acquiring surface shape information in the long side direction with high accuracy, the measurement conditions may be changed during the measuring of the shape of the memory hole accordingly. In addition, if particularly desirable measurement conditions for the incident azimuth angle φ are known by from experiments in advance, it can be possible to set measurement conditions based on known design data for the memory hole (e.g., design dimensions). For example, it is assumed that as pitch becomes increases, the measurement accuracy will increase the more the oblique incidence angle α decreases. Further, it can typically be assumed that it is not necessary to perform a high accuracy measurement near the extremes of the incident azimuth angles φ (nearby 0° and 90° in FIG. 2) other than for the direction parallel to the short side and the long side of the memory hole. In this case, it is desirable to reduce the oblique incidence angle as the pitch becomes longer. Further, it is also desirable to increase the irradiation time when the incident azimuth angle is parallel to the short side and to the long side of the memory hole, and to decrease the other irradiation times.

FIG. 4 is a diagram showing example measurement conditions according to an embodiment. According to FIG. 4, the incident azimuth angle range R1 (see FIG. 2) is −5° to 5°, the incident azimuth angle range R2 (see FIG. 2) is 5° to 85°, and the incident azimuth angle range R3 is 85° to 95°. The oblique incidence angle α, the rotational speed, and the slit width are examples of measurement conditions that can be varied.

In the range R1, measurement for acquiring the shape information mainly in the short side direction of the memory hole 110 is being performed. The oblique incidence angle α is set to 0.24°, the rotation speed is set to 1,000 sec/10°, and the slit width is set to 0.09 mm. In this way, it is possible to perform the measurement capable of acquiring the shape information in the short side direction of the memory hole 110 with high accuracy.

In the range R3, measurement for acquiring the shape information in the long side direction of the memory hole 110 is mainly being performed. The oblique incidence angle α is set to 0.25°, the rotation speed is set to 1,500 sec/10°, and the slit width is set to 0.15 mm. In this way, it is possible to perform the measurement capable of acquiring the shape information in the long side direction of the memory hole 110 with high accuracy.

In the range R2, the measurement for acquiring shape information other than the shape information in the short side direction or long side direction, such as a curvature in a planar shape of the memory hole 110, is being performed. Therefore, the importance of the range R2 is lower than the ranges R1 and R3, and it is desirable to spend as little time in the measurement process as possible. As such, the oblique incidence angle is set to 0.24°, the rotation speed is set to 300 sec/10°, and the slit width is set to 0.15 mm.

The full range of the incident azimuth angle φ at which measurement is performed is divided into a plurality of different regions (sub-ranges), and different measurement conditions can be set for adjacent regions. It is noted that the measurement conditions shown in FIG. 4 are only an example. Measurement conditions for measuring the cross-sectional shape of each memory hole can be optimized such that the contrast and the intensity of the scattered X-rays Lo are optimized. In this way, it is possible to improve the measurement accuracy.

The computing unit 30 has a data processing unit 31, a simulation unit 32, and a shape calculation unit 33. The data processing unit 31 calculates a scattering profile from the two-dimensional image detected by the two-dimensional detector 14 and outputs the scattering profile to the shape calculation unit 33. In the present embodiment, as shown in FIG. 4, the rotation speeds are different in the ranges R1, R2, and R3. This means that the irradiation time of the incident X-ray Li on the measurement target, that is, an exposure time, differs depending on the incident azimuth angle ϕ. Therefore, it is not possible to directly compare the X-ray intensities of the scattering profile calculated from the scattering data detected in the respective ranges R1 to R3. In order to compare the X-ray intensities calculated for the ranges R1 to R3 having different exposure times, the calculated X-ray intensity may be normalized to a per unit time value by dividing the calculated X-ray intensity by the exposure time at each incident azimuth angle. As such, the X-ray intensity of the scattering profile calculated by the data processing unit 31 is normalized to X-ray intensity per unit time according to exposure times at each incident azimuth angle ϕ.

The simulation unit 32 uses design date to simulate an estimated scattering profile expected to be obtained by irradiating a periodic structure matching the design data with incident X-rays. The simulation unit 32 uses a shape model having a plurality of shape parameters. The simulation unit 32 outputs the estimated scattering profile to the shape calculation unit 33.

Figure 5A:
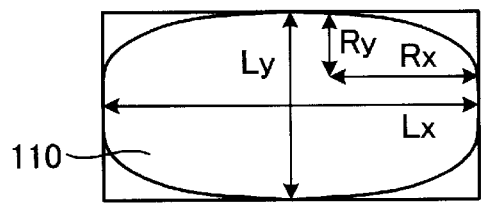
FIGS. 5A, 5B, and 5C are diagrams depicting aspects of a shape model used in a simulation of a memory hole.
Figure 5B:
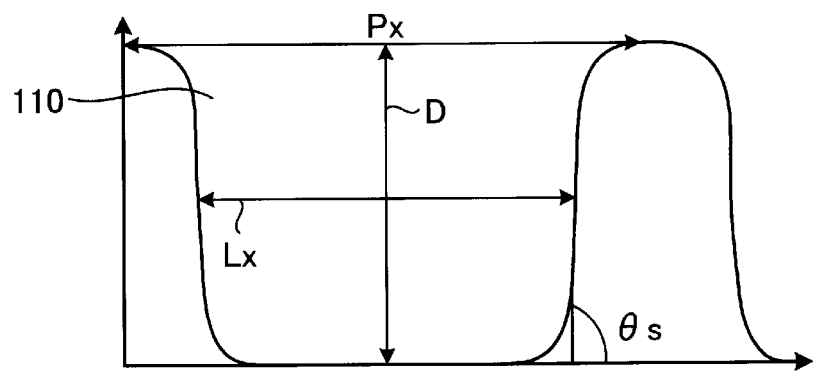
Figure 5C:
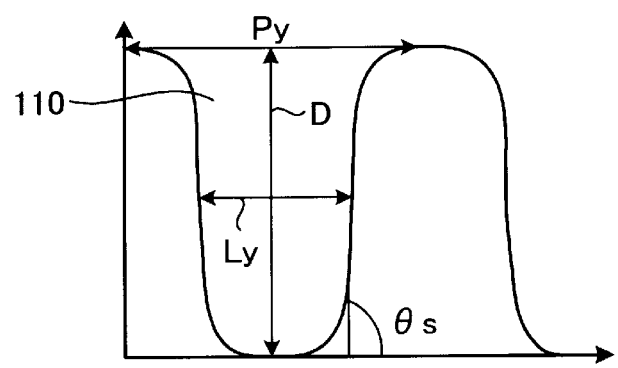

FIGS. 5A, 5B, and 5C are diagrams showing an example of a shape model of a memory hole used in a simulation. FIG. 5A is a planar shape model. FIG. 5B is a cross-sectional shape model in a long side direction. FIG. 5C is a cross-sectional shape model in the short side direction. The shape model parameters include dimensions such a long side Lx, a short side Ly, respective radius of curvature Rx and Ry at the position where the outline of the pattern crosses the X axis and the Y axis, a depth D, a sidewall angle $\theta_s$ formed by the sidewall of the memory hole with a bottom surface, a pitch Px in the X direction (long side direction), and a pitch Py in the Y direction (short side direction). It is noted that the shape parameters shown here are examples, and other shape parameters may be used in addition to or in place of these.

The expected intensity at each position of the scattered X-ray for a virtual memory hole (obtained by setting shape parameters in the model shape) irradiated with incident X-rays according to the measurement conditions, is calculated by simulation, and the estimated scattering profile is obtained.

The shape calculation unit 33 calculates the three-dimensional shape by fitting the scattering profile and the estimated scattering profile. Specifically, the shape calculation unit 33 performs a fitting process which acquires one estimated scattering profile from a plurality of estimated scattering profiles and determines whether the difference between the scattering profile and the acquired estimated scattering profile is within a predetermined range. The shape calculation unit 33 performs the fitting process by acquiring a different estimated scattering profile until an estimated scattering profile in which the difference falls within the predetermined range is obtained. When the estimated scattering profile in which the difference falls within the predetermined range is obtained, the shape calculation unit 33 sets the shape parameter used to create the estimated scattering profile as shape information of the measured memory hole.

Figure 6:
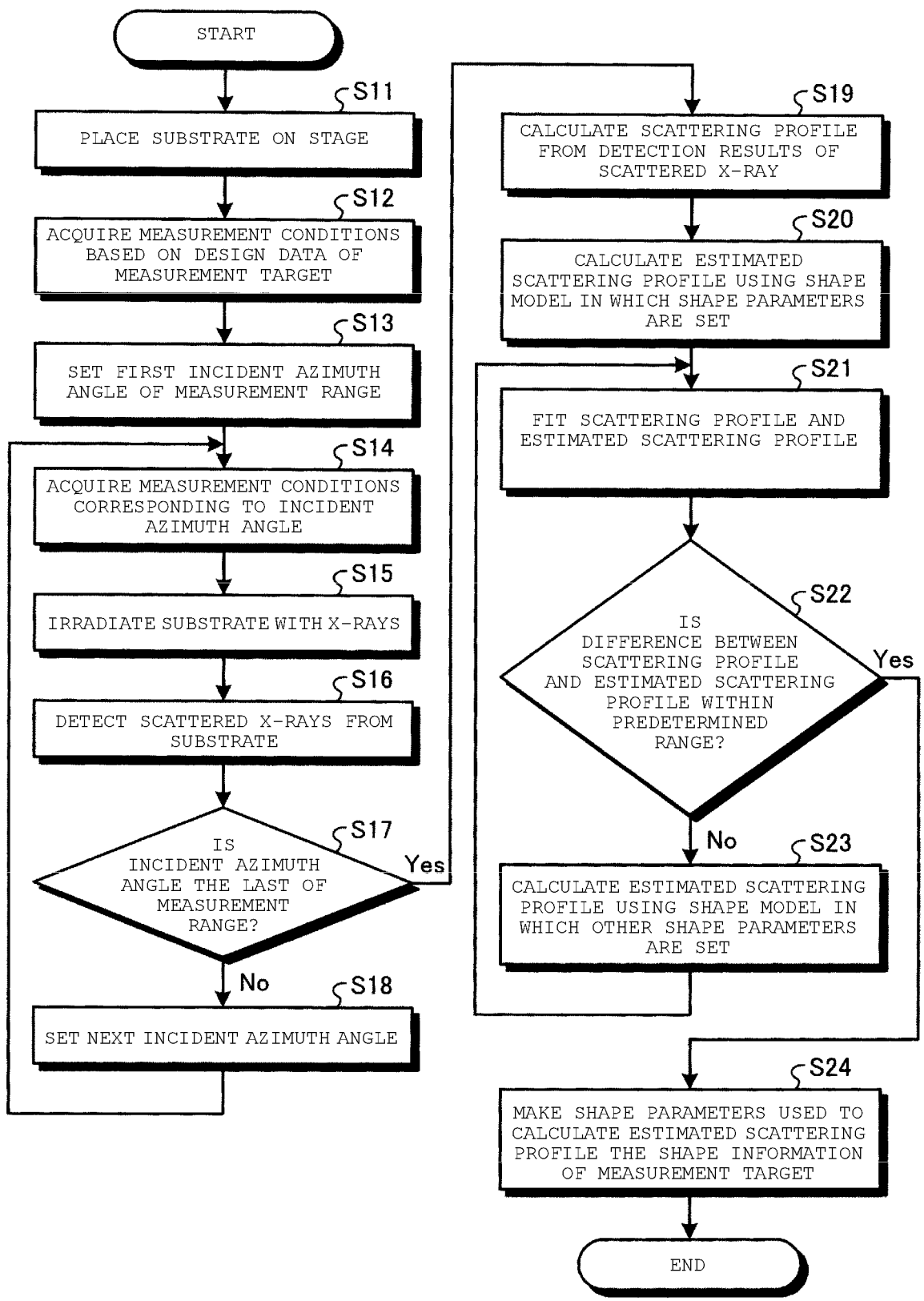
FIG. 6 is a flowchart depicting aspects of a shape measurement procedure according to an embodiment.

Next, a shape measurement method in such a shape measurement apparatus 1 will be described. FIG. 6 is a flowchart illustrating an example of a shape measurement method procedure according to the embodiment. First, the substrate 100 to be measured is placed on the stage 11 (step S11). At this time, an arrangement position is adjusted so that the reference direction of the memory holes 110 in the substrate 100 coincides with the incident direction of the incident X-ray Li. For example, in a case of FIG. 2, the long side direction (X direction) of the memory holes 110 is set so as to coincide with the incident direction of the incident X-ray Li.

Next, the condition setting unit 24 acquires measurement conditions based on the known design data of the measurement target (step S12), and the stage control unit 21 sets a first incident azimuth angle ϕ of a measurement range in the measurement conditions (step S13). For example, in a case of FIG. 4, since the total measurement range is −5° to 95°, the incident azimuth angle ϕ is set to −5°.

Thereafter, the stage control unit 21, the light source control unit 22, and the slit width control unit 23 acquire the measurement conditions corresponding to the set incident azimuth angle ϕ (step S14), and perform control based on the measurement conditions. For example, in a case of FIG. 4, the stage control unit 21 controls the stage 11, the light source control unit 22 controls the X-ray tube 12, and the slit width control unit 23 controls the divergence slit 13 according to the measurement conditions for the oblique incidence angle α, the rotation speed, and the slit width.

Then, the surface of the substrate 100 is irradiated with the incident X-ray Li generated by the X-ray tube 12 through the divergence slit 13 (step S15), and the scattered X-rays Lo from the substrate 100 are detected by the two-dimensional detector 14 (Step S16). Once the exposure time specified by the measurement conditions has elapsed at the current incident azimuth angle ϕ, it is determined whether the current incident azimuth angle ϕ is the last angle of the measurement range (step S17). If the current incident azimuth angle ϕ is not the last angle in the measurement range (No in step S17) then the next incident azimuth angle ϕ is set (step S18), and the process returns to step S14. Then, the processes in steps S14 to S18 are repeatedly executed until the incident azimuth angle ϕ is the last angle in the measurement range.

If the incident azimuth angle ϕ is the last angle in the measurement range (Yes in step S17) then the data processing unit 31 calculates the scattering profile from the detection results of the scattered X-rays Lo detected by the two-dimensional detector 14 (Step S19). The simulation unit 32 calculates an estimated scattering profile using a shape model in which shape parameters are set (step S20). Thereafter, the shape calculation unit 33 performs fitting of the scattering profile and the estimated scattering profile (step S21) and determines whether the difference between the scattering profile and the estimated scattering profile is within the predetermined range (step S22).

When the difference is not within the predetermined range (No in step S22), the simulation unit 32 calculates an estimated scattering profile using the shape model in which the shape parameters different from those of step S20 are set (step S23), and the process returns to step S21. Then, the processes of steps S21 to S23 is repeatedly executed until the difference between the scattering profile and the estimated scattering profile falls within the predetermined range. In other words, the simulation unit 32 continues vary the shape parameters to create an estimated scattering profile until the estimated scattering profile and the scattering profile converge to a certain difference or less.

When the difference is within the predetermined range (Yes in step S22), the shape calculation unit 33 outputs the shape parameters used for calculating the estimated scattering profile as the shape information of the measurement target (step S24), and the shape measurement process is terminated.

Figure 7:
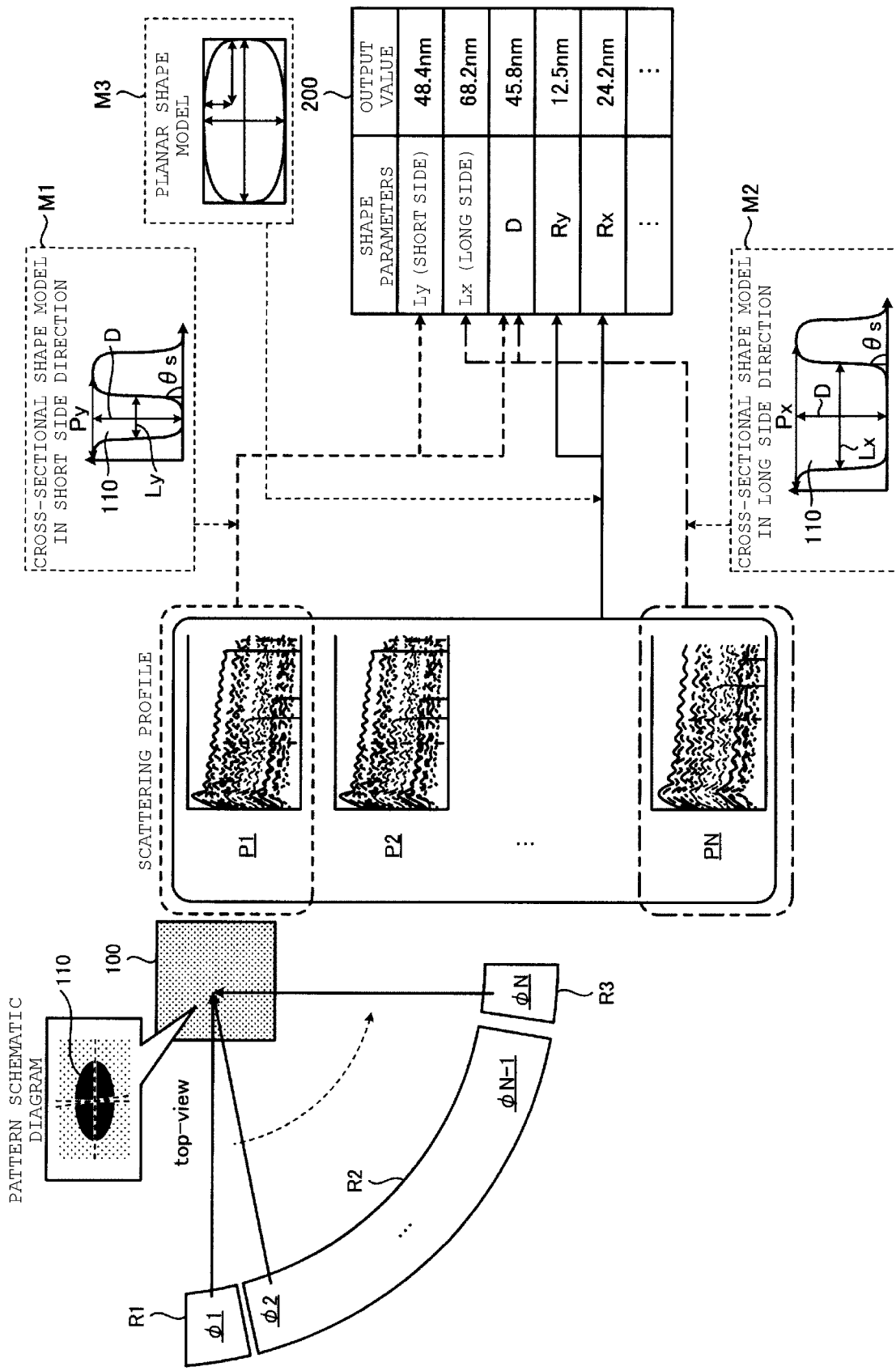
FIG. 7 is a diagram schematically depicts various aspects of a shape measurement procedure according to an embodiment.

FIG. 7 is a diagram schematically showing the shape measurement method procedure according to the embodiment. The substrate 100 is placed on the stage 11, and measurement is performed with incident azimuth angles ϕ1 to ϕN. The incident azimuth angle ϕ1 is included in the range R1 in FIG. 2, the incident azimuth angles ϕ2 to ϕN−1 are included in the range R2, and the incident azimuth angle ϕN is included in the range R3. Further, as illustrated in FIG. 4, different measurement conditions are set for each of the ranges R1 to R3.

The measurement by X-ray is performed in the order of incident azimuth angles ϕ1, ϕ2 . . . ϕN−1, ϕN. For each incident azimuth angle ϕi (i=1, 2 . . . N), measurement is performed under the measurement conditions determined for each incident azimuth angle ϕi. Scattering profiles P1, P2 . . . PN are calculated from the measurement results at the incident azimuth angle ϕ1, ϕ2 . . . ϕN, respectively.

When acquiring the shape in the short side direction, the estimated (simulated) scattering profile obtained from simulating the scattering of X-rays and the scattering profile P1 are fitted by adjusting one or more shape parameters in the cross-sectional shape model M1. In addition, when acquiring the shape in the long side direction, the estimated scattering profile and the scattering profile PN are fitted by adjusting one or more shape parameters in the cross-sectional shape model M2. Further, when acquiring the planar shape, estimated scattering profiles and the scattering profiles P1 to PN are fitted, by adjusting certain shape parameters in the planar shape model M3. As a result of these fittings, estimated scattering profiles in which the difference falls within a predetermined range are acquired, and the corresponding shape parameters are outputted as the shape information 200 for the measurement target. For example, the short side (Ly) and the depth (D) are obtained from the scattering profile P1 (in the short side direction), and the long side (Lx) and the depth (D) are obtained from the scattering profile PN (in the long side direction). Curvature (Rx, Ry) and or like are obtained from the scattering profiles P1 to PN.

In the above description, the case where the shape of a memory hole is measured as the structures portion is presented as an example, however, the present embodiment is not limited thereto. For example, in general, any shape can be measured if it is arranged periodically in two dimensions, such as a hole, a column, or a pillar. And the structured portion need not be related to a memory hole. Furthermore, the planar shape need not be a rectangular shape but, in general, any planar shape can be evaluated such as an elliptical shape, a circular shape, a square shape, or the like.

In the above description, GISAXS is used in shape measurement apparatus 1, however, the present disclosure is not limited thereto. For example, the present disclosure may also be applied to an optical critical dimension (OCD) measurement tool that performs a shape measurement using another electromagnetic wave such as visible light.

Figure 8:
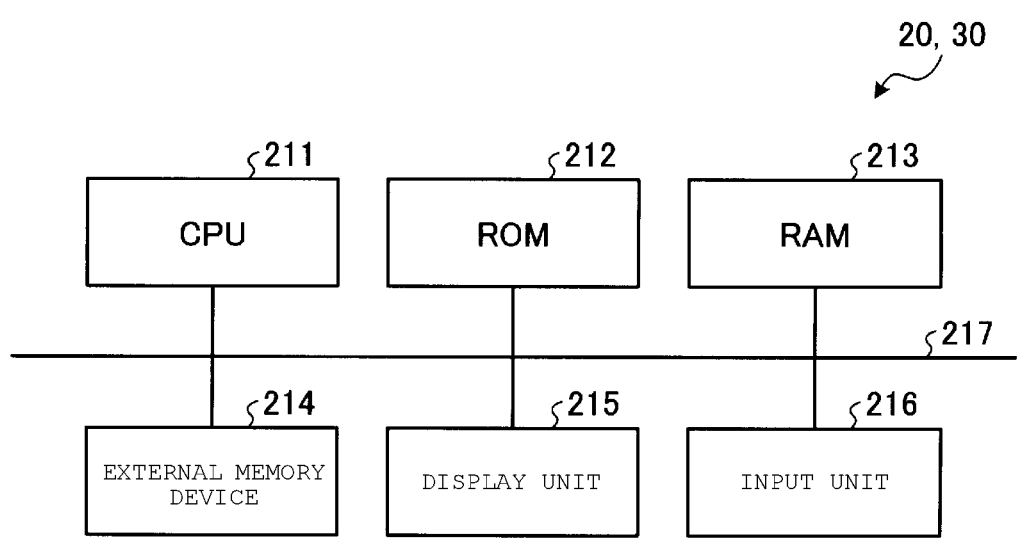
FIG. 8 depicts a hardware configuration of a computing unit and a control unit.

The control unit 20 and the computing unit 30 described above are implemented by an information processing apparatus. FIG. 8 is a diagram showing an example of a hardware configuration of the computing unit and the control unit. The control unit 20 and the computing unit 30 include a central processing unit (CPU) 211, a read only memory (ROM) 212, a random access memory (RAM) 213 as a main memory, a hard disk drive (HDD), an external storage device 214 such as an solid state drive (SSD) or compact disc (CD) drive device, a display unit 215 such as a display device, and an input unit 216 such as a keyboard or a mouse. These are connected via bus lines 217, and have a hardware configuration using a common computer.

The program executed by the control unit 20 of the embodiment executes the shape measurement method shown in steps S12 to S18 in FIG. 6, and can be provided by being recorded in a non-transitory computer readable recording medium such as a CD-ROM, a flexible disk (FD), a CD-R, and a digital versatile disk (DVD) in an installable format or an executable format file.

Also, the program executed by the computing unit 30 executes the shape measurement method shown in steps S19 to S24 in FIG. 6. This program may be provided by being recorded in a non-transitory computer readable recording medium such as a CD-ROM, a flexible disk (FD), a CD-R, and a digital versatile disk (DVD) in an installable format or an executable format file.

Further, the programs executed by the control unit 20 and the computing unit 30 may be stored on a computer connected to a network such as the Internet and provided by being downloaded via the network. The programs executed by the control unit 20 and the computing unit 30 may be configured to be provided or distributed via a network such as the Internet.

A program of the present embodiment may be provided by being incorporated in advance in a ROM or the like.

In FIG. 1, the case where the control unit 20 and the computing unit 30 are independently provided of each other is shown; however, the control unit 20 and the computing unit 30 may be configured as one information processing apparatus.

In the example embodiment, when measuring the shape of the array of structured portions periodically arranged in two dimensions, measurement is performed by changing the measurement conditions, such as changing of an oblique incidence angle α, a rotational speed of the substrate 100, or a slit width, with the array in a specific orientation of the structured portions and then other orientations. Also, the estimated scattering profile obtained using simulation with the model shape is fitted by varying model shape parameters to the scattering profile obtained from the measurement result. Thereafter, the shape parameters providing the smallest difference between the scattering profile and the estimated scattering profile are taken as the shape information for the measurement target. In this way, it is possible to acquire a cross-sectional shape of the structured portion with high accuracy at a specific orientation. Thus, shape information close to the actual three-dimensional structure can be obtained by this method. That is, it is possible to measure the shape of the periodically arranged minute pattern with high accuracy regardless of the orientation.

On the other hand, when measurements for all orientations are performed under the measurement conditions suitable for acquiring the scattering profile in one particular orientation of the structured portion, the scattering profile obtained at other orientations may not be optimal in some cases. There is a possibility that the shape information of the three-dimensional structure of the structure portion obtained thereby deviates from the shape information of the actual three-dimensional structure. In the embodiment, as compared with such a case, it is possible to reduce deviation from the actual three-dimensional structure.

Further, in the example embodiment, the measurement conditions are set so that the irradiation time is increased in the measurement at the orientation(s) most important for obtaining the shape information, and the irradiation time is reduced for the measurements of the less important orientations. As a result, the total time required for the measurement is shortened and measurement throughput can be improved as compared with the case where the measurement is performed at the same rotation speed at every orientation.

Furthermore, when the irradiation time is shortened, the slit width can be widened so as to increase the intensity of the scattered electromagnetic waves. In this way, even though the irradiation time is short, sufficient intensity can still be obtained for the scattered electromagnetic waves, so the analysis accuracy can be improved.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A substrate measurement method, comprising:
   irradiating a substrate with an electromagnetic wave at a plurality of incident azimuth angles with respect to an orientation of a repetitive array on the substrate, the irradiating conditions being varied for different incident azimuth angle ranges, the repetitive array comprising a pattern feature;
   measuring scattering intensity of the electromagnetic waves scattered from the substrate at each different incident azimuth angles; and
   calculating shape information for the pattern feature based on the scattering intensity of the electromagnetic waves at the plurality of incident azimuth angles, wherein
   calculating the shape information for the pattern feature comprises, simulating an estimated scattering intensity for the electromagnetic waves based on known design data for the pattern feature and adjusting shape parameters for the pattern feature until the estimated scattering intensity matches the measured scattering intensity within a predetermined threshold.

2. The substrate measurement method according to claim 1, wherein the incident angle of the electromagnetic waves at a surface of the substrate is changed for different incident azimuth angle ranges.

3. The substrate measurement method according to claim 2, wherein a slit width for changing a beam size for the electromagnetic waves incident on the substrate is changed for the different incident azimuth angle ranges.

4. The substrate measurement method according to claim 2, wherein an irradiation beam dwell time for the electromagnetic waves is changed for the different incident azimuth angle ranges.

5. The substrate measurement method according to claim 1, wherein a slit width for changing a beam size for the electromagnetic waves incident on the substrate is changed for different incident azimuth angle ranges.

6. The substrate measurement method according to claim 1, wherein a irradiation beam dwell time for the electromagnetic waves is changed for different incident azimuth angle ranges.

7. The substrate measurement method according to claim 6, wherein the irradiation beam dwell time is changed by changing a substrate rotational speed.

8. The substrate measurement method according to claim 1, wherein the incident azimuth angle ranges encompasses a first range from −5° to 5° with respect to a main axial direction of the pattern features, a second range from greater than 5° to 85° with respect to the main axial direction of the pattern features, and a third range from greater than 85° to 95° with respect to the main axial direction of the pattern features.

9. The substrate measurement method according to claim 1, wherein the pattern feature comprises a hole in a surface of the substrate.

10. The substrate measurement method according to claim 1, wherein the measured scattering intensity is normalized using an irradiation time, and the shape information of the pattern feature is calculated based on the normalized scattering intensity.

11. A substrate measurement apparatus, comprising:
    a stage on which a substrate having a repetitive array can be placed, the repetitive array comprising a plurality of pattern features;
    a light source configured to irradiate the substrate with electromagnetic waves at a variable incident angle with respect to a surface of the substrate, the light source and the stage being configured to permit the substrate to be irradiated at a plurality of incident azimuth angles with respect to an orientation of the repetitive array on the substrate;
    a detector configured to measure a scattering intensity of the electromagnetic waves scattered from the substrate;
    a controller configured to:
        control at least one the stage and the light source to vary incident azimuth angle within a predetermined measurement range; and
        calculate shape information for pattern features in the repetitive array based on the scattering intensity of the electromagnetic waves measured by the detector for the plurality of incident azimuth angles,
    wherein the controller varies the irradiating conditions for different incident azimuth angle ranges, and
    wherein the controller is configured to calculate the shape information for the pattern features by simulating an estimated scattering intensity for the electromagnetic waves based on known design data for the pattern features in the repetitive array and adjusting shape parameters for the pattern features until the estimated scattering intensity matches the measured scattering intensity within a predetermined threshold.

12. The substrate measurement apparatus according to claim 11, wherein
    at least one of the light source and the stage is configured to permit the incident angle of the electromagnetic waves at a surface of the substrate to be changed, and
    the controller is further configured to vary the incident angle for different incident azimuth angle ranges.

13. The substrate measurement apparatus according to claim 12, wherein
    a slit width of the light source for changing a beam size for the electromagnetic waves incident on the substrate can be changed, and the controller is further configured to change the slit width for the different incident azimuth angle ranges.

14. The substrate measurement apparatus according to claim 12, wherein
the stage is configured to rotate the substrate at different rates, and
the controller is further configured to rotate the substrate at different rates to vary an irradiation beam dwell time for the electromagnetic waves for the different incident azimuth angle ranges.

15. The substrate measurement apparatus according to claim 11, wherein
a slit width of the light source for changing a beam size for the electromagnetic waves incident on the substrate can be changed, and
the controller is further configured to change the slit width for the different incident azimuth angle ranges.

16. The substrate measurement apparatus according to claim 11, wherein
the stage is configured to rotate the substrate at different rates, and
the controller is further configured to rotate the substrate at different rates to vary an irradiation beam dwell time for the electromagnetic waves for the different incident azimuth angle ranges.

17. The substrate measurement apparatus according to claim 11, wherein the controller is configured to normalize measured scattering intensity using an irradiation time, and calculate the shape information of the pattern features based on the normalized scattering intensity.

18. The substrate measurement apparatus according to claim 11, wherein the electromagnetic waves are X-rays.

* * * * *